United States Patent [19]

Miwada

[11] Patent Number: 5,049,960
[45] Date of Patent: Sep. 17, 1991

[54] CHARGE COUPLED DEVICE FREE FROM AFTER IMAGE DUE TO RESIDUAL ELECTRIC CHARGES

[75] Inventor: Kazuo Miwada, Tokyo, Japan
[73] Assignee: NEC Corporation, Tokyo, Japan
[21] Appl. No.: 482,096
[22] Filed: Feb. 20, 1990
[30] Foreign Application Priority Data
  Feb. 20, 1989 [JP] Japan ................................. 1-40770
[51] Int. Cl.⁵ ...................... H01L 29/78; G11C 19/28
[52] U.S. Cl. .......................................... 357/24; 377/58
[58] Field of Search ....................... 357/24; 377/57-63
[56] References Cited

U.S. PATENT DOCUMENTS

| | | | |
|---|---|---|---|
| 3,856,989 | 12/1974 | Weimer ........................... | 357/24 LR |
| 4,322,753 | 3/1982 | Ishihara ........................... | 357/24 LR |
| 4,484,210 | 11/1984 | Shiraki et al. .................. | 357/24 LR |
| 4,696,021 | 9/1987 | Kawahara et al. ............. | 357/24 LR |

Primary Examiner—Gene M. Munson
Attorney, Agent, or Firm—Sughrue, Mion, Zinn, Macpeak & Seas

[57] ABSTRACT

A charge coupled device comprises a plurality of photo electric converting elements of the p-n junction diode type, and the photo electric converting elements are coupled to associated vertical shift registers through gate transistors, in which n-type impurity region of each photo electric converting element has a wide portion accumulating electric charges produced in the presence of an optical radiation and a narrow portion partially overlapped with a transfer gate electrode of the gate transistor and having a width not allowing any narrow channel phenomenon to take place, so that no residual electric charges is left in the n-type impurity region without producing any potential barrier between the wide and narrow portions.

3 Claims, 11 Drawing Sheets

CHARGE COUPLED DEVICE FREE FROM AFTER IMAGE DUE TO RESIDUAL ELECTRIC CHARGES

FIELD OF THE INVENTION

This invention relates to a charge coupled device and, more particularly, to the configuration of a photo electric converting element.

DESCRIPTION OF THE RELATED ART

A solid state line sensor is implemented by a charge coupled device and used as an image sensor associated with an automatic focus controlling mechanism of a camera or incorporated in a facsimile machine.

FIG. 1 shows the layout of a prior art charge coupled device fabricated on a p-type semiconductor substrate 1, and a p-type channel stopper 2 provides an electrical isolation between adjacent photo electric converting elements 3 and 4 and a shift register 5. The p-type channel stopper 2 is indicated by hatch lines for better understanding. As will be better seen from FIG. 2, each of the photo-electric converting elements 3 and 4 is implemented by the p-n junction type photo diode, and the photo electric converting element 4 is, by way of example, formed by an n-type impurity region 6 partially overlapped with a p-type impurity region 7. The n-type impurity region 6 is reversely biased with respect to the p-type semiconductor substrate 1. In the surface portion of the semiconductor substrate 1 is further formed an n-type impurity region 8 which forms the shift register 5 together with transfer gate electrodes 9, 10, 11 and 12 embedded in an insulating film 13 in a partially overlapping manner. The transfer gate electrodes 9 and 10 are supplied with a first phase clock pulse CL1, and a second phase clock pulse CL2 is fed to the transfer gate electrodes 11 and 12. The shift register 5 thus arranged transfers a data signal in the form of electric charges in synchronization with the two phase clock signal in the left direction of FIG. 1. Photo shield plates 14 and 15 are provided on the insulating film 13 and are spaced from each other for exposing a part of photo electric converting elements 3 and 4 to an optical radiation carrying photo images, and parts of the optical radiation are converted into electric charges the amounts of which are dependent to the respective intensities of the parts of the optical radiation. Although the photo electric converting element 4 is spaced apart form the shift register 5, a transfer gate electrode 16 allows the electric charges to flow into the shifr register 5. The transfer gate electrode 16 is partially overlapped with the n-type impurity region 6 at a overlapping area L encircled by dash lines 17, and the edge of the transfer gate electrode 9 extends below the transfer gate electrode 16. Then, the electric charges accumulated in the n-type impurity region 6 are read out to the shift register 5 in the presence of a transfer pulse Pt of a high voltage level fed to the transfer gate electrode 16, and the shift register 5 transfers the electric charges in synchronization with the two phase shift clock signal as described above.

However, a problem is encountered in the prior art charge coupled device in that residual electric charges Qr are left in the overlapping area L due to an undesirable potential well produced under the transfer gate electrode 16 as shown in FIG. 3. Namely, when the transfer pulse Pt of the high voltage level is applied to the transfer gate electrode 16, most of the electric charges flow into the n-type impurity region 8 under the transfer gate electrode 9, however, the residual electric charges Qr are left in the potential well and gradually discharged into the shift register 5 over a relatively large time constant. Thus, even though no effective electric charge is produced in the photo electric converting element 4, the residual electric charges Qr flow into the shift register 5 in the presence of the transfer pulse Pt of the high voltage level, and are causative of an after image.

The residual electric charges may be reduced by decreasing the overlapping area to a certain extent allowed in consideration of a nesting tolerance. However, this approach never satisfies the user.

SUMMARY OF THE INVENTION

It is therefore an important object of the present invention to provide a charge coupled device which completely transfers electric charges from photo electric converting elements to a shift register.

To accomplish the above object, the present invention proposes to decrease a leading end portion of an n-type impurity region in width to a certain extent preventing the n-type impurity region from a narrow channel phenomenon.

In accordance with the present invention, there is provided a charge coupled device fabricated on a lightly doped semiconductor substrate of a first conductivity type, comprising: a) a plurality of photo electric converting elements implemented by a plurality of first impurity region of a second conductivity type formed in the semiconductor substrate and a plurality of second impurity regions of the first conductivity type respectively formed in the first impurity regions so as to form p-n junctions, respectively, the photo electric converting elements being formed into a plurality of element groups; b) a plurality of vertical shift registers respectively associated with the plurality of element groups and having third impurity regions of the second conductivity type, respectively; c) an insulating film covering the first, second and third impurity regions; and d) a plurality of gate transistors provided between the photo electric converting elements and the associated vertical shift registers, respectively, and having transfer gate electrodes respectively extending over channel forming areas between the first impurity regions and the third impurity regions, the first impurity regions being partially located under transfer gate electrodes, respectively, in which each of the first impurity regions comprises a wide portion and a narrow portion contiguous to the wide portion and having a boss sub-portion located in that area not overlapped with the transfer gate electrode and a leading end sub-portion overlapped with the transfer gate electrode, and in which the width of the boss sub-portion is greater than a critical value where a narrow channel phenomenon takes place.

BRIEF DESCRIPTION OF THE DRAWINGS

The features and advantages of a charge coupled device according to the present invention will be more clearly understood from the following description taken in conjunction with the accompanying drawings in which.

DESCRIPTION OF THE PREFERRED EMBODIMENTS

First Embodiment

Figure 1:
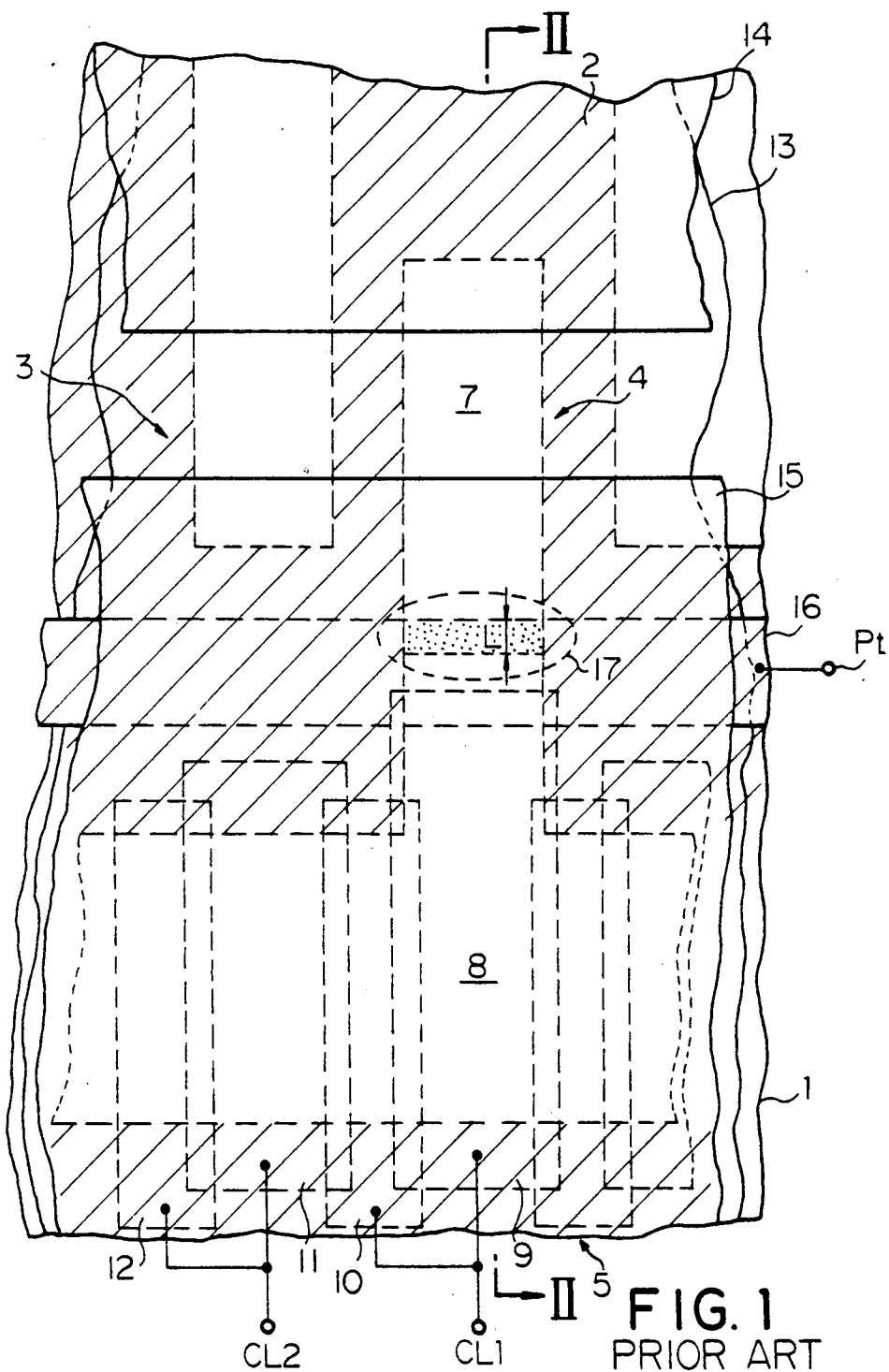
FIG. 1 is a plan view showing the layout of a prior art charge coupled device.
Figure 2:
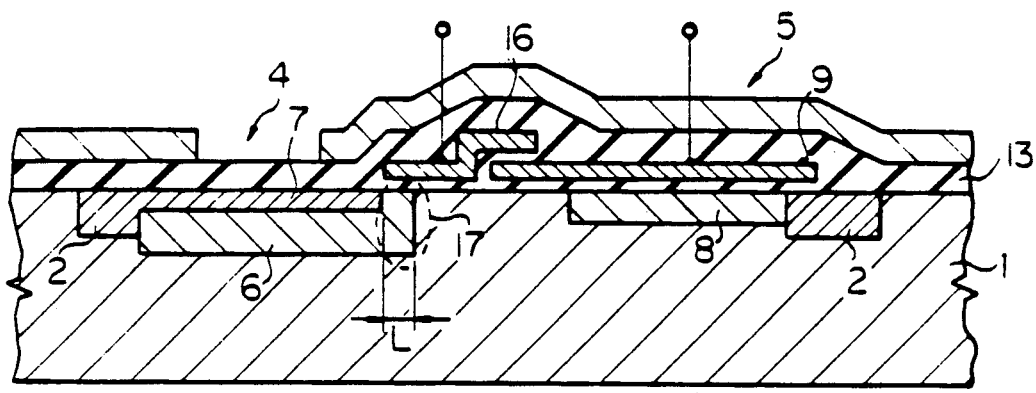
FIG. 2 is a cross sectional view taken along line II—II of FIG. 1 and showing the structure of the prior art charge coupled device.
Figure 3:
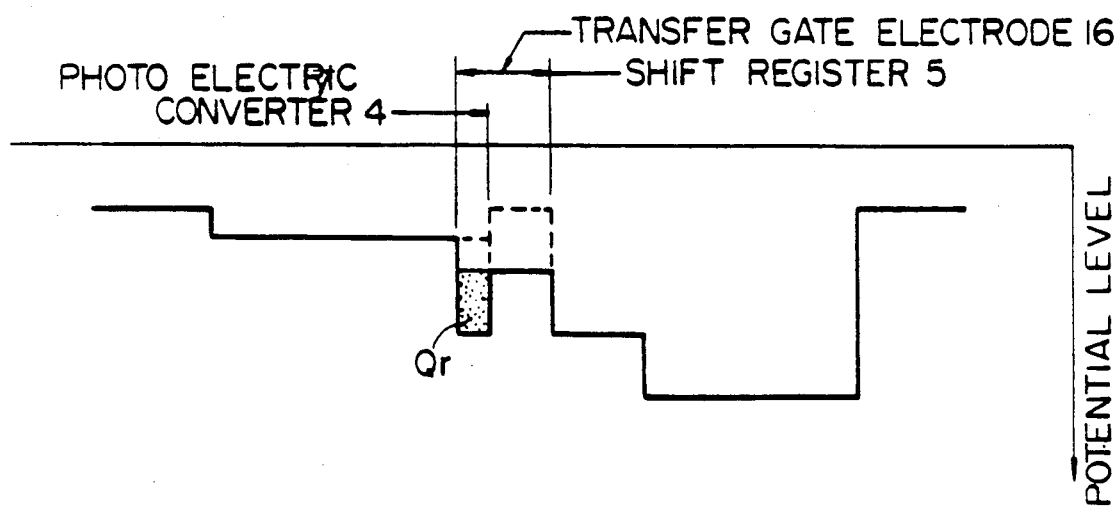
FIG. 3 is a diagram showing the potential profile produced in the prior art charge coupled device.
Figure 4:
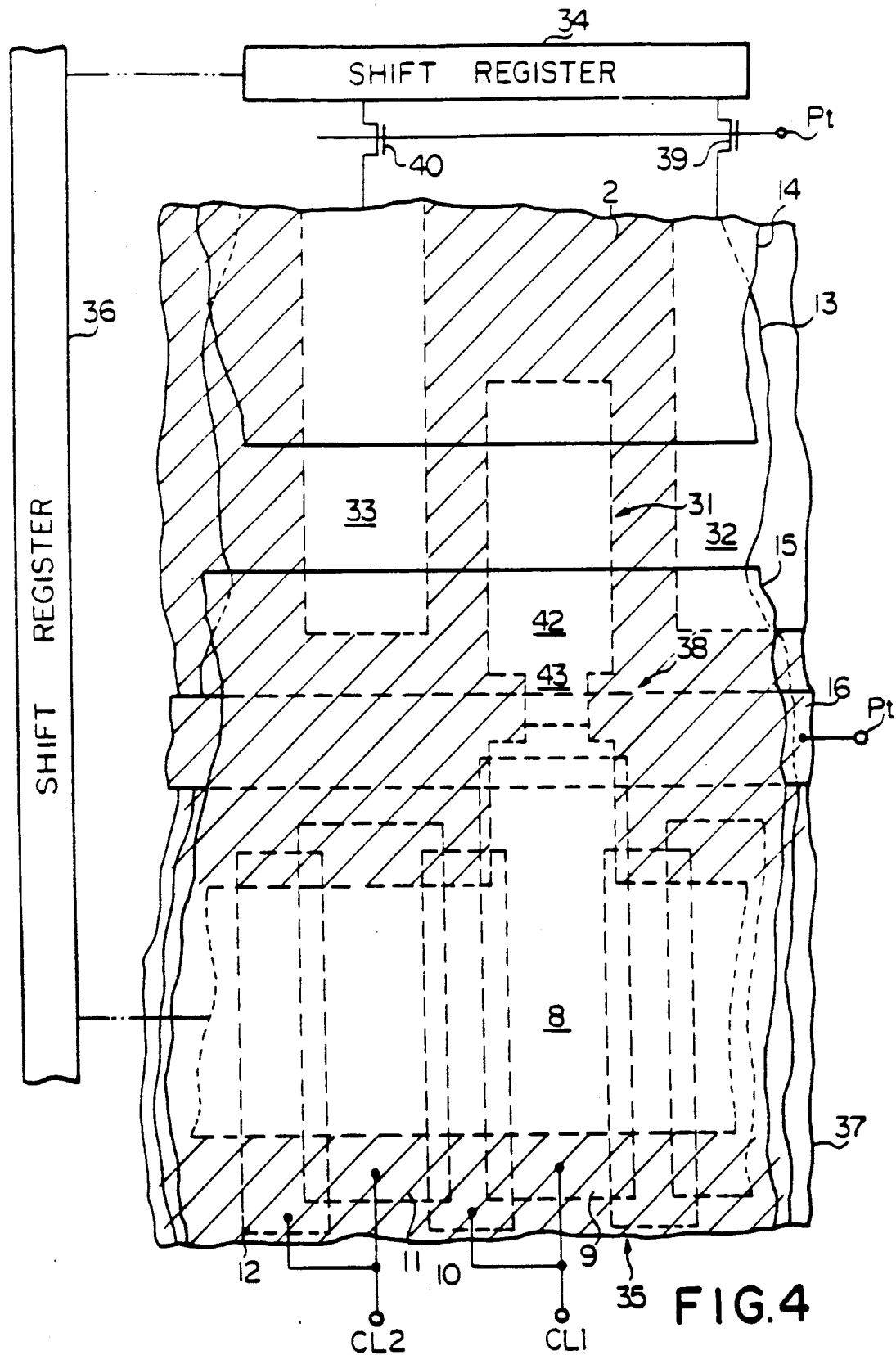
FIG. 4 is a plan view showing the layout of an essential part of a charge coupled device embodying the present invention.

Referring first to FIG. 4 of the drawings, a charge coupled device embodying the present invention largely comprises a photo array 30 having a plurality of photo electric converting elements including elements 31, 32 and 33, a plurality of vertical shift registers including registers 34 and 35 and a horizontal shift register 36, and these components are fabricated on a single semiconductor substrate 37. The photo electric converting elements are implemented by p-n junction type diodes, respectively. The photo electric converting elements 31 to 33 are coupled to the associated vertical shift registers 34 and 35 through gate transistors 38, 39 and 40, and the vertical shift registers 34 and 35 are in turn coupled to a horizontal shift register 36. When an optical radiation carrying images is fallen upon the photo electric converting elements 31 to 33, the photo electric converting elements 31 to 33 produce electric charges depending upon the intensities of respective parts of the optical radiation, and the electric charges are transferred through the transfer gates to the vertical shift registers 34 and 35 in the presence of a transfer pulse Pt of an active high voltage level. The electric charges thus flowing into the vertical shift registers 34 and 35 are conveyed in synchronization with a two phase clock signal consisting of a first phase clock pulse CL1 and a second phase clock pulse CL2. The electric charges then flows into the horizontal shift register 36, and sequentially extracted from the horizontal shift register 36. The electric charges this sequentially extracted from the horizontal shift register 36 are used for reproducing the images on a display unit. The charge coupled device according to the present invention is similar to that shown in FIG. 1 with the exception of the configuration of each of the photo electric converting elements 31 to 33, and, for this reason, other elements, regions and films are designated by the same reference numerals used in FIG. 1 without any detailed description, and the heavily doped channel stopper 2 is indicated by hatch lines. All of the photo electric converting elements are identical with one another, so that description is made on the photo electric converting element 31 only with reference to FIG. 5.

Figure 5:
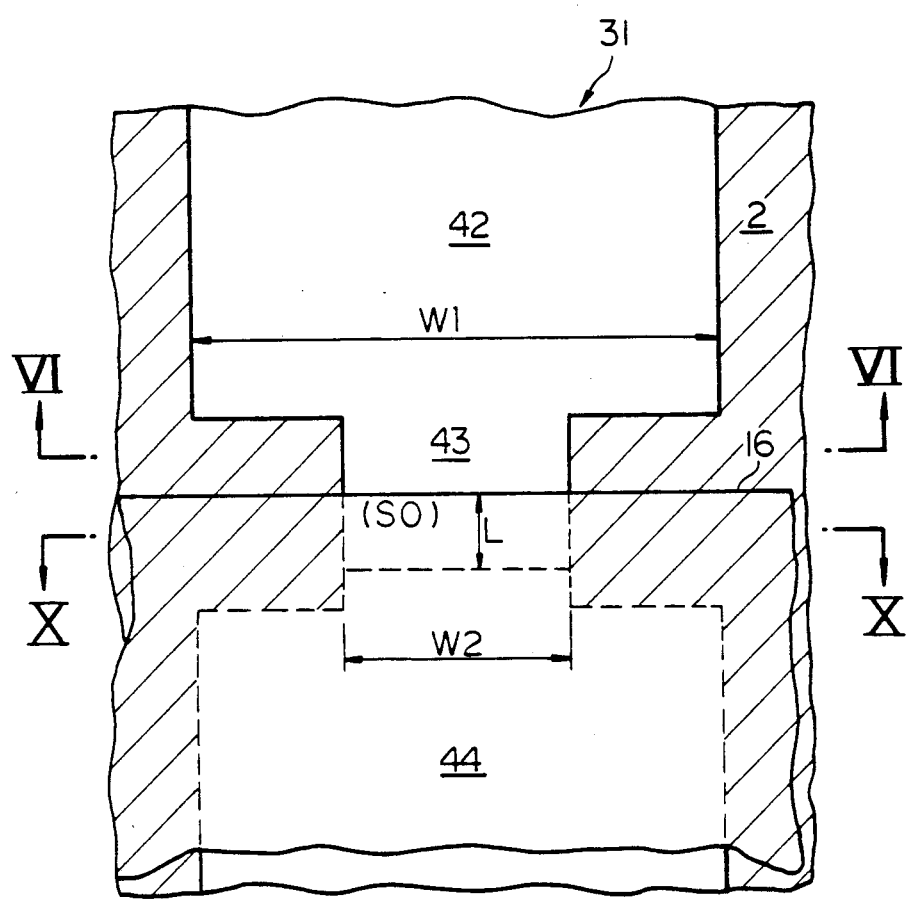
FIG. 5 is a plan view showing a transfer gate between a photo electric converting element and a shift register of the charge coupled device shown in FIG. 4.

Turning to FIG. 5 of the drawings, the photo electric converting element 31 has a generally rectangular wide portion 42 and a narrow portion 43 contiguous to the wide portion 43, and the narrow portion 43 extends below the transfer gate electrode 16 of the gate transistor 38. Although the photo electric converting element 31 is implemented by an n-type impurity region 51 contacting a p-type impurity region 52 as similar to the prior art photo electric converting element (see FIG. 6), the p-type impurity region 52 is removed from the leading end sub-portion of the narrow portion 43 overlapped with the transfer gate electrode 16. A channel forming area 44 is defined by the channel stopper 2 and is contiguous to the leading end sub-portion of the narrow portion 43. In this instance, the wide portion 42 is about 14 microns in width (W1), and the narrow portion 43 is as narrow as about 6 microns (W2). Assuming now that the narrow portion 43 is overlapped with the transfer gate electrode 16 by about 2 microns (L), the overlapping area S0 is calculated as $L \times W2 = 12$ square microns, and $6 \times 10^2$ residual electric charges are actually measured in the overlapping area S0. If no narrow portion is formed below the transfer gate electrode 16 as similar to the prior art charge coupled device, the overlapping area (S1) is as large as 28 square micron and, accordingly, results in $2.4 \times 10^3$ residual electric charges. Thus, the narrow portion 43 is conducive to substantial reduction in the amount of the residual electric charges Qr, and any after image is less liable to take place on the display unit.

Figure 6:
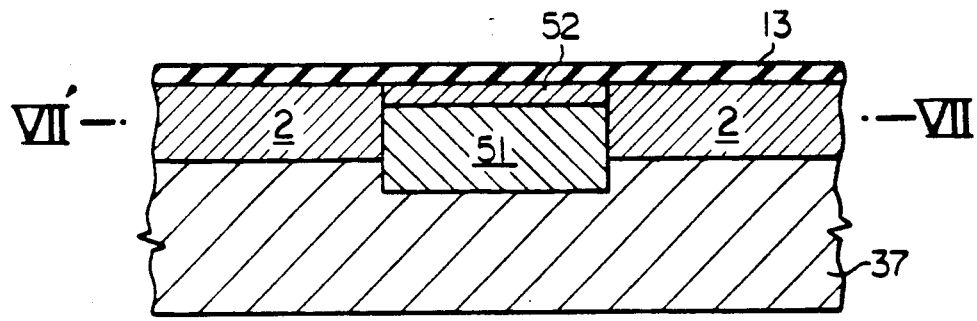
FIG. 6 is a cross sectional view taken along line VI—VI of FIG. 5 and showing the structure around a narrow portion of an n-type impurity region forming a part of the photo electric converting element.
Figure 7:
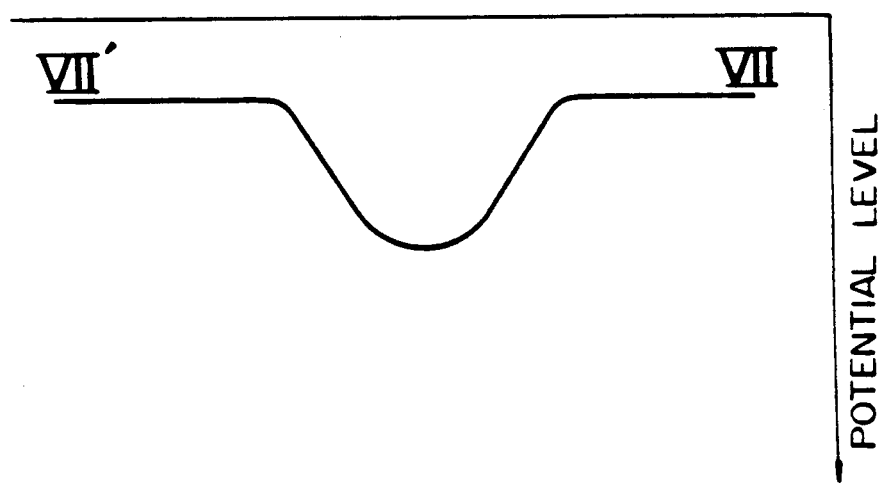
FIG. 7 is a graph showing the potential level along line VII—VII' of FIG. 6.
Figure 8A:
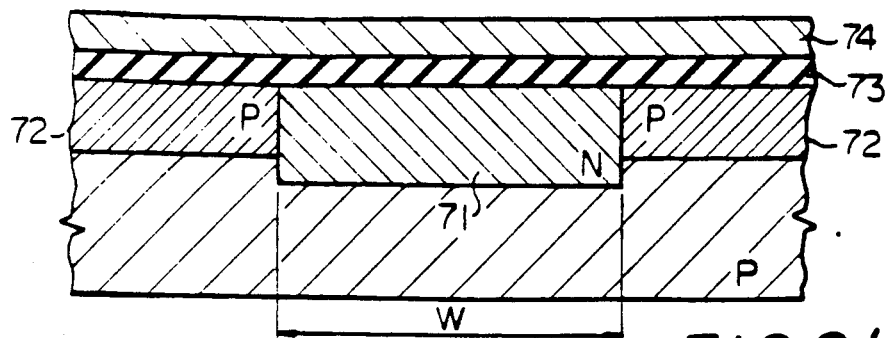
FIGS. 8(A) to 8(D) are cross sectional views showing a variety of the structure of the narrow portion.
Figure 8B:
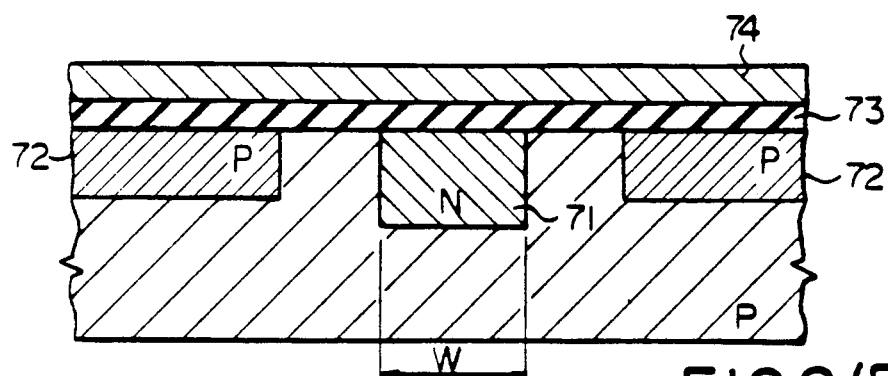
Figure 8C:
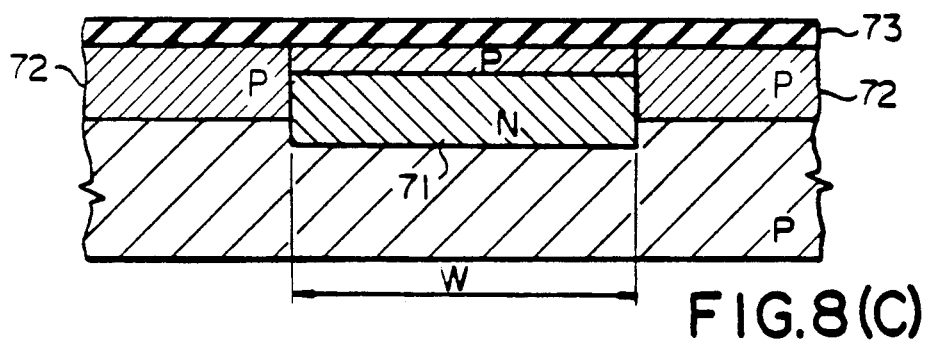
Figure 8D:
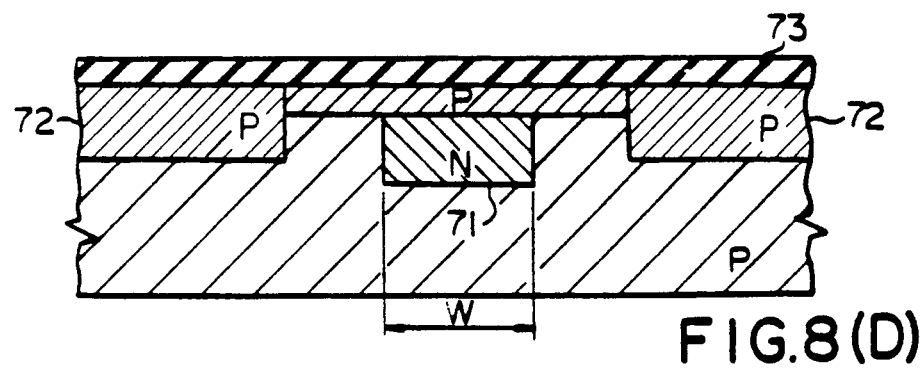

The narrower the better in view of the reduction in the residual electric charges, however, if the width W2 is smaller than a critical value, undesirable narrow channel phenomenon takes place in the boundary area between the wide portion 42 and the narrow portion 43. As shown in FIG. 6, the p-type channel stopper are formed on both sides of the n-type impurity region 51, and, for this reason, depletion layers extend from the p-n junctions between the n-type impurity region 51 and the p-type channel stopper 2 into the n-type impurity region 51. These depletion layers are causative of lifting the potential edge at the both side portions of the n-type impurity region 51 as shown in FIG. 7.

Figure 9:
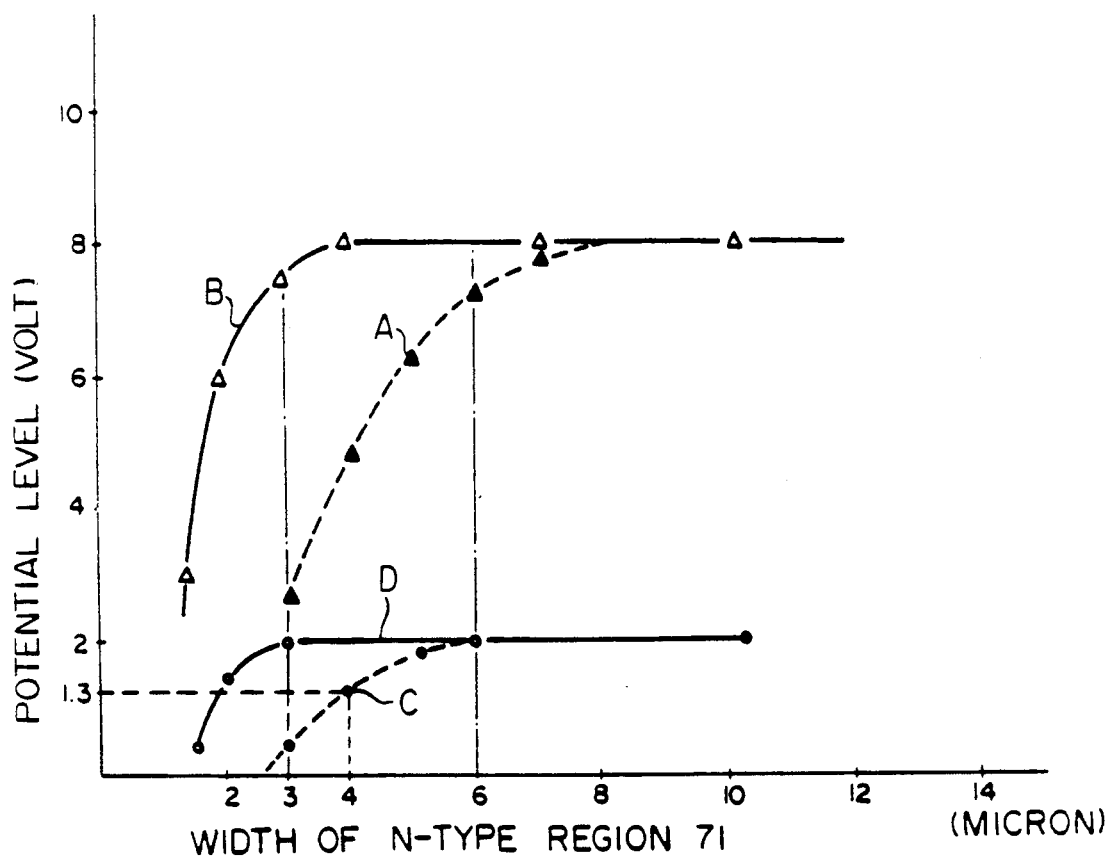
FIG. 9 is a graph showing the potential level in terms of the width of the narrow portion.
Figure 10:
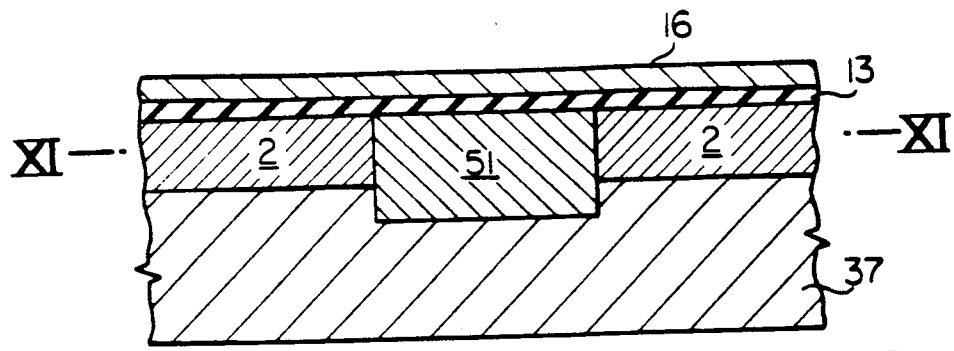
FIG. 10 is a cross sectional view taken along line X—X of FIG. 5 and showing the structure of the leading end sub-portion under the transfer gate electrode.
Figure 11:
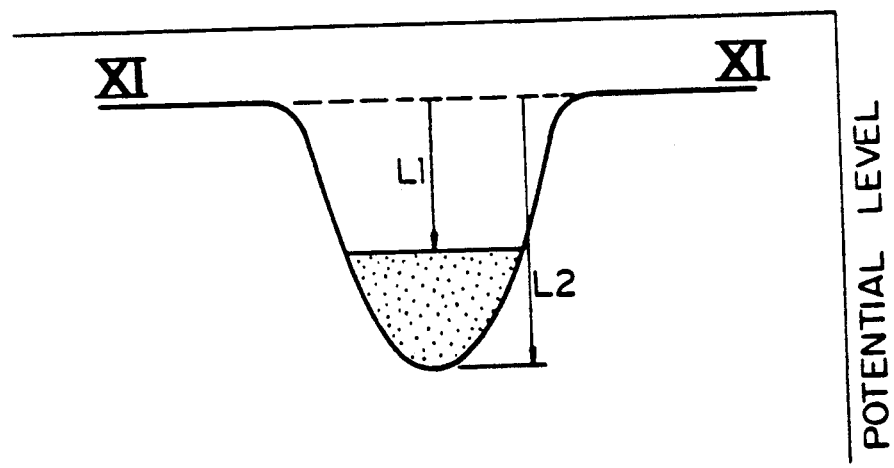
FIG. 11 is a graph showing the potential level along line XI—XI of FIG. 10.

In detail, FIGS. 8(A) to 8(D) show a variety of channel configuration, and W is indicative of the width of an n-type impurity region 71. Reference numerals 72, 73 and 74 respectively designate a p-type channel stopper, an insulating film and a conductive film. The narrow portion 43 is of the structure shown in FIG. 8(C), and the potential level in terms of the width W traces Plots C of FIG. 9. In this structure, if the width is decreased to a value less than 6 microns, the potential level is lowered than that in the wide portion 42, and such a potential gap means a potential barrier between the wide portion 42 and the narrow portion 43 against the electric charges. In fact, if the width W2 of the narrow portion 43 is of the order of 4 microns, the potential level thereof is about 1.3 volt, and, for this reason, the potential barrier of about 0.7 volt takes place between the wide portion 42 and the narrow portion 43. Thus, the narrow portion 43 needs to be equal to or greater than about 6 microns so as to avoid the potential barrier or the narrow channel phenomenon. The narrow portion 43 beneath the transfer gate electrode 16 is of the structure shown in FIG. 8(A), and the potential level in terms of the width W is represented by Plots A of FIG. 9. Namely, the leading sub-portion of the narrow portion 43 consists of the n-type impurity region 51 only as shown in FIG. 10. Plots A teaches us that potential level L2 at 6 microns is about 7.5 volts, so that the narrow channel phenomenon takes place in the width W of the order of 6 microns. However, the narrow portion 43 below the transfer gate electrode 16 merely allows the electric charge to pass therethrough, and the width W2 of the order of 6 micron is not causative of any problem because the potential level L2 is greater than the potential level L1 of 2 volts in the wide portion 42 (see FIG. 11).

Second Embodiment

Figure 12:
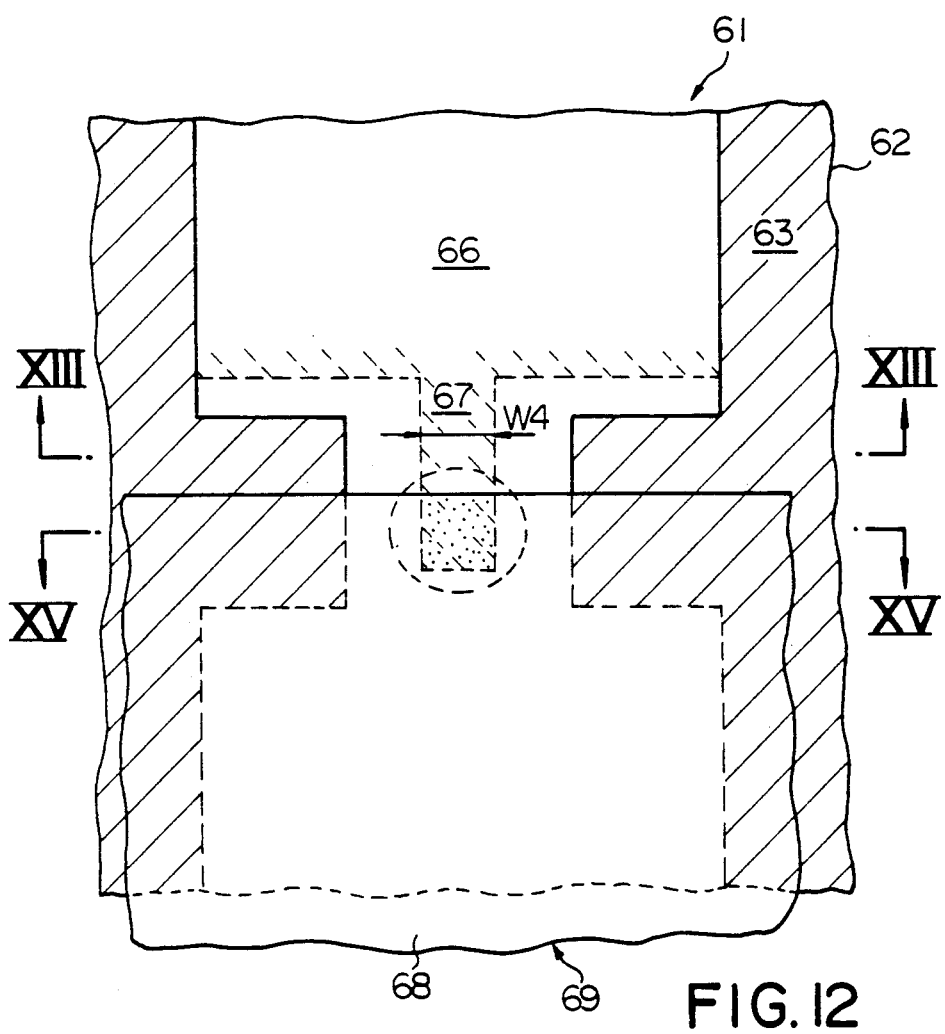
FIG. 12 is a plan view showing the layout of a part of a photo electric converting element incorporated in another charge coupled device embodying the present invention.

Turning to FIG. 12 of the drawings, a photo electric converting element 61 is fabricated on a semiconductor substrate 62 and defined by a p-type channel stopper 63 indicated by hatch lines. The photo electric converting element 61 is implemented by an n-type impurity region 64 partially covered with a p-type impurity region 65 as will be seen from FIG. 13, and the n-type impurity region 64 has a generally rectangular wide portion 66 and a narrow portion 67 projecting from the wide portion 66. The narrow portion 67 extends under a transfer gate electrode 68 of a gate transistor 69, so that a leading sub-portion of the narrow portion 67 is located under the transfer gate electrode 68, but a boss sub-portion is not overlain by the gate electrode 68. Though not shown in the drawings, the gate transistor 69 provides a bridge between the photo electric converting element 61 and a vertical shift register (not shown) as similar to the charge coupled device shown in FIG. 4, and the vertical shift register in turn is coupled to a horizontal shift register (not shown).

Figure 13:
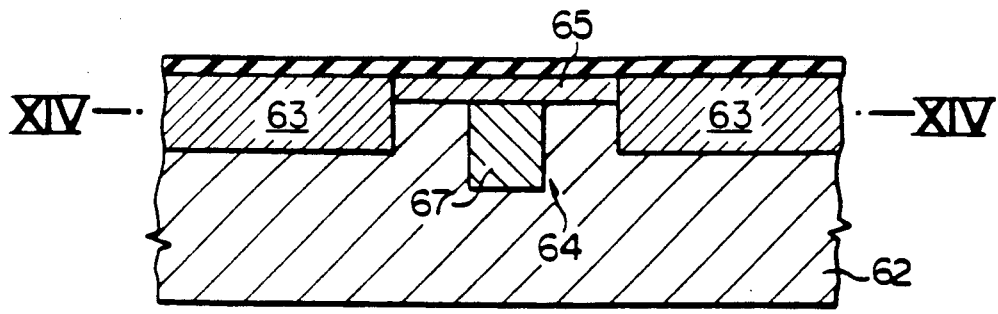
FIG. 13 is a cross sectional view taken along line XIII—XIII and showing the structure of a narrow portion of a photo electric converting region incorporated in the charge coupled device shown in FIG. 12.
Figure 14:
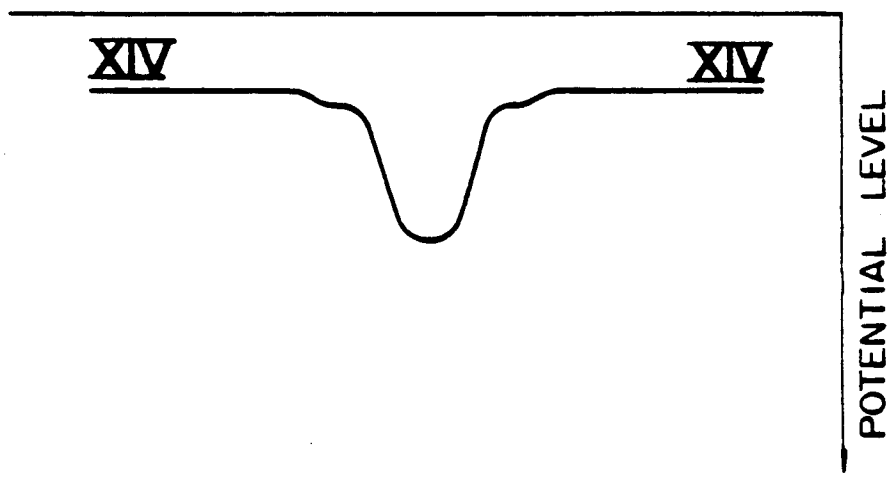
FIG. 14 is a graph showing the potential level along line XIV—XIV of FIG. 13.
Figure 15:
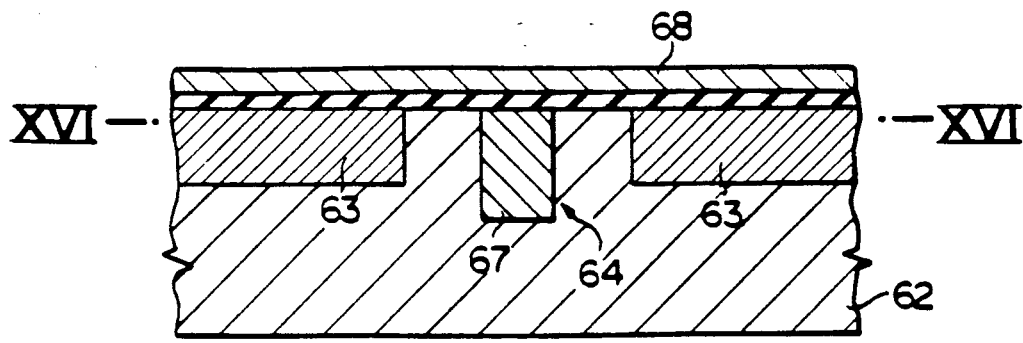
FIG. 15 is a cross sectional view taken along line XVI—XVI of FIG. 12 and showing the structure of the leading end bus-portion of the narrow portion.
Figure 16:
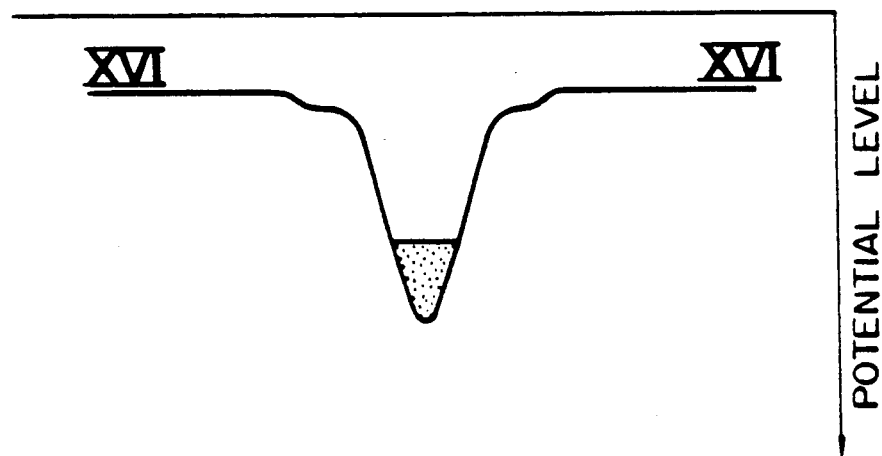
FIG. 16 is a graph showing the potential level along line XVI—XVI of FIG. 15.

As will be better seen from FIG. 13, the narrow portion 67 is not contiguous to the heavily doped channel stopper 63, but the lightly doped p-type semiconductor substrate 62 intervenes between the channel stopper 63 and the narrow portion 67. The photo electric converting element 61 thus arranged is of the structure shown in FIG. 8(D), and the potential level in terms of the width W varies along Plots C of FIG. 9. Comparing Plots A with Plots C, the narrow channel phenomenon is less liable to take place in the n-type impurity region 64 rather than the n-type impurity region 51. This is because of the fact that depletion layers easily extend into the lightly doped semiconductor substrate 62. In fact, no narrow channel phenomenon takes place in so far as the width of the narrow portion 67 is not less than about 3 microns. At the leading sub-portion, the narrow channel phenomenon takes place, but the potential level is much larger than about 2 volts in the wide portion 66, so that the leading end sub-portion provides a conduction path which allows the electric charges to smoothly flow into the vertical shift register as shown in FIG. 16.

By virtue of the narrow portion 67 contiguous to the lightly doped semiconductor substrate 62, the narrow portion 67 is decreased in width W4 to about 3 microns, and an overlapping area S3 is given as $W4 \times L = 6$ square micron. The overlapping area S3 thus reduced results in the residual electric charges of about $3 \times 10^2$ which is a eighth of the residual electric charges produced in the prior art charge coupled device. As a result, any after image is effectively eliminated from a display unit.

As will be understood from the foregoing description, the residual electric charges are drastically reduced from the photo electric converting element according to the present invention without any serious problem in the nesting tolerance.

Although particular embodiments of the present invention have been shown and described, it will be obvious to those skilled in the art that various changes and modifications may be made without departing from the spirit and scope of the present invention.

What is claimed is:

1. A charge coupled device fabricated on a lightly doped semiconductor substrate of a first conductivity type, comprising;
   a) a plurality of photo electric converting elements implemented by a plurality of first impurity region of a second conductivity type formed in said semiconductor substrate and a plurality of second impurity regions of said first conductivity type respectively formed in the first impurity regions so as to form p-n junctions, respectively, said photo electric converting elements being formed into a plurality of element groups;
   b) a plurality of vertical shift registers respectively associated with said plurality of element groups and having third impurity regions of said second conductivity type, respectively;
   c) an insulating film covering said first, second and third impurity regions; and
   d) a plurality of gate transistors provided between said photo electric converting elements and the associated vertical shift registers, respectively, and having transfer gate electrodes respectively extending over channel forming areas between said first impurity regions and said third impurity regions, said first impurity regions being partially located under transfer gate electrodes, respectively, in which each of said first impurity regions comprises a wide portion and a narrow portion contiguous to the wide portion and having a boss sub-portion located in that area not overlapped with said transfer gate electrode and a leading end sub-portion overlapped with said transfer gate electrode, and in which said narrow portion is separated from a heavily doped channel stopper of said first conductivity type by said semiconductor substrate smaller in impurity concentration than the channel stopper.

2. A charge coupled device fabricated on a lightly doped semiconductor substrate of a first conductivity type, comprising:
   a) a plurality of photo electric converting elements implemented by a plurality of first impurity region of a second conductivity type formed in said semiconductor substrate and a plurality of second impurity regions of said first conductivity type respectively formed in the first impurity regions so as to form p-n junctions, respectively, said photo electric converting elements being formed into a plurality of element groups;

b) a plurality of vertical shift registers respectively associated with said plurality of element groups and having third impurity regions of said second conductivity type, respectively;

c) an insulating film covering said first, second and third impurity regions; and d) a plurality of gate transistors provided between said photo electric converting elements and the associated vertical shift registers, respectively, and having transfer gate electrodes respectively extending over channel forming areas between said first impurity regions and said third impurity regions, said first impurity regions being partially located under transfer gate electrodes, respectively, in which each of said first impurity regions comprises a wide portion and a narrow portion contiguous to the wide portion and having a boss sub-portion located in that area not overlapped with said transfer gate electrode and a leading end sub-portion overlapped with said transfer gate electrode, and in which said narrow portion is contiguous to a heavily doped channel stopper of said first conductivity type, wherein said narrow portion is not less than about 6 microns in width.

3. A charge coupled device fabricated on a lightly doped semiconductor substrate of a first conductivity type, comprising:

a) a plurality of photo electric converting elements implemented by a plurality of first impurity region of a second conductivity type formed in said semiconductor substrate and a plurality of second impurity regions of said first conductivity type respectively formed in the first impurity regions so as to form p-n junctions, respectively, said photo electric converting elements being formed into a plurality of element groups;

b) a plurality of vertical shift registers respectively associated with said plurality of element groups and having third impurity regions of said second conductivity type, respectively;

c) an insulating film covering said first, second and third impurity regions; and d) a plurality of gate transistors provided between said photo electric converting elements and the associated vertical shift registers, respectively, and having transfer gate electrodes respectively extending over channel forming areas between said first impurity regions and said third impurity regions, said first impurity regions being partially located under transfer gate electrodes, respectively, in which each of said first impurity regions comprises a wide portion and a narrow portion contiguous to the wide portion and having a boss sub-portion located in that area not overlapped with said transfer gate electrode and a leading end sub-portion overlapped with said transfer gate electrode, and in which said narrow portion is separated from a heavily doped channel stopper of said first conductivity type by said semiconductor substrate smaller in impurity concentration than the channel stopper, wherein said narrow portion is not less than about 3 microns in width.

* * * * *